(12) United States Patent
Wang

(10) Patent No.: US 6,856,358 B1
(45) Date of Patent: Feb. 15, 2005

(54) PHASE-INCREASE INDUCED BACKPORCH DECREASE (PIBD) PHASE RECOVERY METHOD FOR VIDEO SIGNAL PROCESSING

(75) Inventor: Ming-Hung Wang, Hsin-Chu (TW)

(73) Assignee: Etron Technology, Inc., Hsin Chu (TW)

( * ) Notice: Subject to any disclaimer, the term of this patent is extended or adjusted under 35 U.S.C. 154(b) by 515 days.

(21) Appl. No.: 10/050,446

(22) Filed: Jan. 16, 2002

(51) Int. Cl.[7] .............................. H04N 5/06; H04N 5/04
(52) U.S. Cl. ...................... 348/537; 348/524; 348/540; 348/536; 348/538
(58) Field of Search ................................ 348/537, 538, 348/536, 500, 540, 508, 529, 530, 531, 510, 524, 533, 425.4, 544, 546, 572; 375/355, 371, 373, 376; 345/213; 386/71, 73, 84, 61; 358/409, 410

(56) References Cited

U.S. PATENT DOCUMENTS

| | | | | | |
|---|---|---|---|---|---|
| 4,232,339 A | * | 11/1980 | Smiley et al. | ............... | 348/495 |
| 4,713,690 A | * | 12/1987 | Watanabe et al. | ........... | 348/537 |
| 4,780,759 A | * | 10/1988 | Matsushima et al. | ....... | 348/537 |
| 5,335,074 A | * | 8/1994 | Stec | ........................... | 348/537 |
| 5,990,968 A | * | 11/1999 | Naka et al. | .................. | 348/537 |
| 6,014,177 A | * | 1/2000 | Nozawa | ...................... | 348/540 |
| 6,069,578 A | * | 5/2000 | Liu et al. | ..................... | 341/122 |
| 6,108,043 A | | 8/2000 | White | ........................ | 348/531 |
| 6,118,486 A | * | 9/2000 | Reitmeier | .................... | 348/441 |
| 6,137,536 A | * | 10/2000 | Yamaguchi | .................. | 348/521 |
| 6,144,413 A | | 11/2000 | Zatsman | ...................... | 348/525 |
| 6,233,020 B1 | | 5/2001 | Wilber | ........................ | 348/543 |
| 6,310,618 B1 | * | 10/2001 | Zhang et al. | ................ | 345/213 |
| 6,452,592 B2 | * | 9/2002 | Zhang et al. | ................ | 345/213 |
| 6,724,381 B2 | * | 4/2004 | Sakashita | ..................... | 345/213 |
| 6,744,472 B1 | * | 6/2004 | MacInnis et al. | ........... | 348/441 |
| 6,753,926 B1 | * | 6/2004 | Nishino | ...................... | 348/537 |

* cited by examiner

Primary Examiner—Michael H. Lee
Assistant Examiner—Jean W. Désir
(74) Attorney, Agent, or Firm—George O. Saile; Stephen B. Ackerman; Douglas R. Schnabel (57) ABSTRACT

A method to generate an optimum phase shifted sampling clock for sampling a synchronized video signal A(t) having a synchronization signal SYNC pulse is achieved. The method comprises, first, generating a sampling clock having a first edge aligned with a trailing edge of the SYNC pulse. The sampling clock period comprises the SYNC pulse period divided by M. Second, the number of sampling clock cycles N is counted from the trailing edge of the SYNC pulse until the A(t) value at the first edge of the sampling clock exceeds a minimum value. Third, the sampling clock and the SYNC pulse are phase shifted forward until the A(t) value at the first edge of the sampling clock first exceeds a minimum value on clock cycle N−1 to thereby establish a worst case phase shift of the sampling clock. Finally, A(t) is sampled at an offset from the worst case phase shift to thereby generate an optimum phase shifted sampling clock.

26 Claims, 7 Drawing Sheets

PHASE-INCREASE INDUCED BACKPORCH DECREASE (PIBD) PHASE RECOVERY METHOD FOR VIDEO SIGNAL PROCESSING

BACKGROUND OF THE INVENTION (1) Field of the Invention

The invention relates to video signal processing, and more particularly, to a phase recovery method and circuit to generate an optimum phase shifted sampling clock for sampling a synchronized video signal having a synchronization signal pulse.

(2) Description of the Prior Art

Cathode ray tube, or CRT, monitors have traditionally dominated the field of desktop computers. However, with the advent of portable computers and handheld, smart devices, the use of flat panel and LCD displays has crown. Recently, flat panel displays have even taken market share in the desktop PC arena. The flat panel features of reduced weight and size offer significant advantages to designers and users.

CRT displays are typically driven using a VGA method wherein the display area is divided into an array of pixels having a number of horizontal and vertical lines. For example, a display area might be divided into 480 horizontal lines with each line having 640 segments or pixels. To display an image, the imaging beam begins at a top corner of the screen and then scans a single horizontal line. When this horizontal line is completed, the beam indexes vertically to the next horizontal line. The scanning continues until the entire screen has been updated with the current image. This process is repeated many times each second to insure good image quality and timely response.

Since the VGA method is very established in the art, it is desirable to make the digital, flat panel display technology compatible with this technique. To facilitate the use of digital displays with VGA drivers and video cards, a basic problem must be overcome. The video signals For the red, green, and blue (RGB) elements of each pixel are analog. However, these video signals must be converted to digital signals to drive the digital pixels of the flat panel display. Therefore, analog-to-digital video signal processing must be performed.

Figure 1:
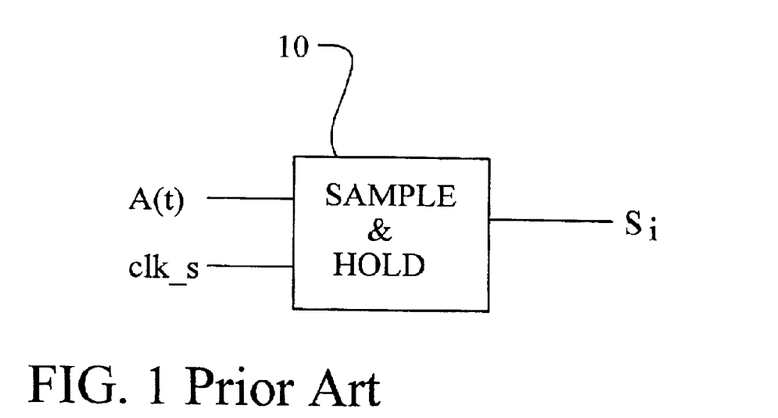
FIG. 1 illustrates a prior art example of a sample and hold circuit used for sampling a video signal.

Referring now to FIG. 1, a prior art video processing block 10 or circuit is shown. In this circuit 10, a sample and hold is performed on the analog video input A(t). For example, A(t) might be one of the color signals from a VGA driver card of a PC. Alternatively, A(t) might be a television video signal. The purpose of the sample and hold circuit 10 is to sample the analog video signal A(t) at a fixed time interval governed by the sampling clock clk_s. The sampled value of A(t) is denoted $S_i$ where $S_i$ is the value at the clk_s cycle. After the sampled value $S_i$ is generated, this value may then be converted to a digital value in an analog-to-digital converter (ADC).

Figure 2:
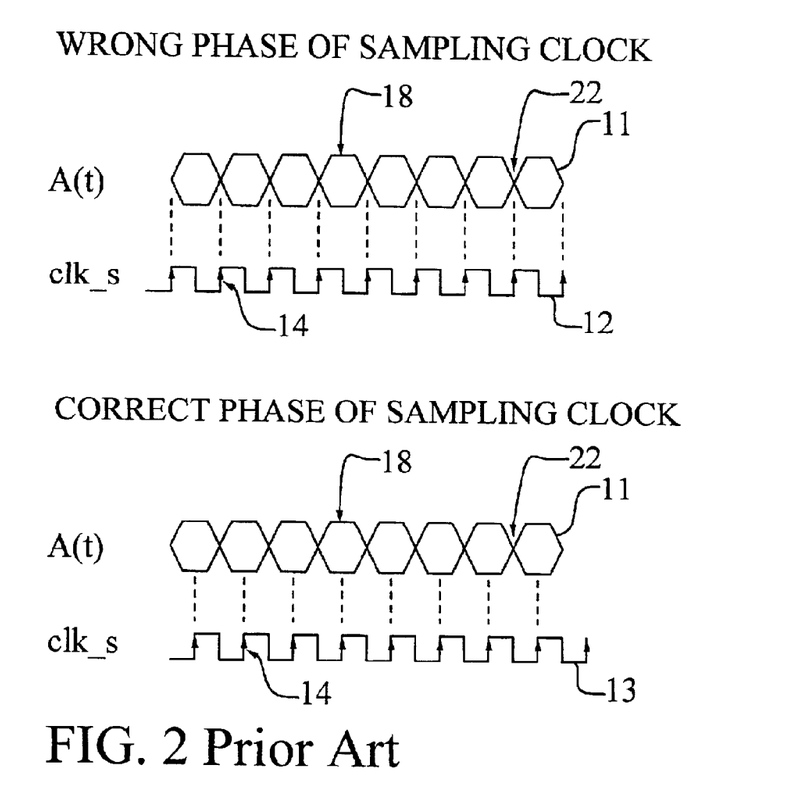
FIG. 2 illustrates a prior art example of a wrong clock phase and a correct clock phase for sampling the video signal.

Referring now to FIG. 2, two timing diagrams are shown to illustrate a potential problem in the sampling process. In the timing diagrams, the analog video signal A(t) and the sampling clock clk_s are shown. The A(t) signal 11 has two states: the pixel value state 18 and the transition state 22. Each pixel value state 18 corresponds to a single location on the display. A(t) changes from pixel state 18 to pixel state 18 such that an entire image line is transmitted serially. The transition times 22 represent a time when the video signal A(t) 11 is in an invalid data state.

As discussed above, the video signal A(t) 11 is sampled at time points governed by the sampling clock clk_s 12 and 13. In this example, the sample points are the rising edges 14 of clk_s. In the first pair of signals A(t) 11 and clk_s 12, the rising edges of the sample clock clk_s are aligned with the transition phase of the video signal A(t). Therefore, the sampled data $S_1$ will be severely distorted. The sampling clock clk_s is said to be in the wrong phase with respect to the video data.

In the second pair of signals A(t) 11 and clk_s 13, the sampling clock phase is moved to a correct relationship. The rising edges of clk_s occur during the valid pixel data phase of the video signal A(t). Therefore, the sampled video signal $S_i$ should be valid. It can be clearly seen that the phase arrangement of the sampling clock clk_s with respect to the video signal A(t) is a critical element in achieving an accurate sample data stream $S_1$ and, ultimately, accurate image reproduction on the digital display. This phase alignment is commonly called phase recovery.

Figure 3:
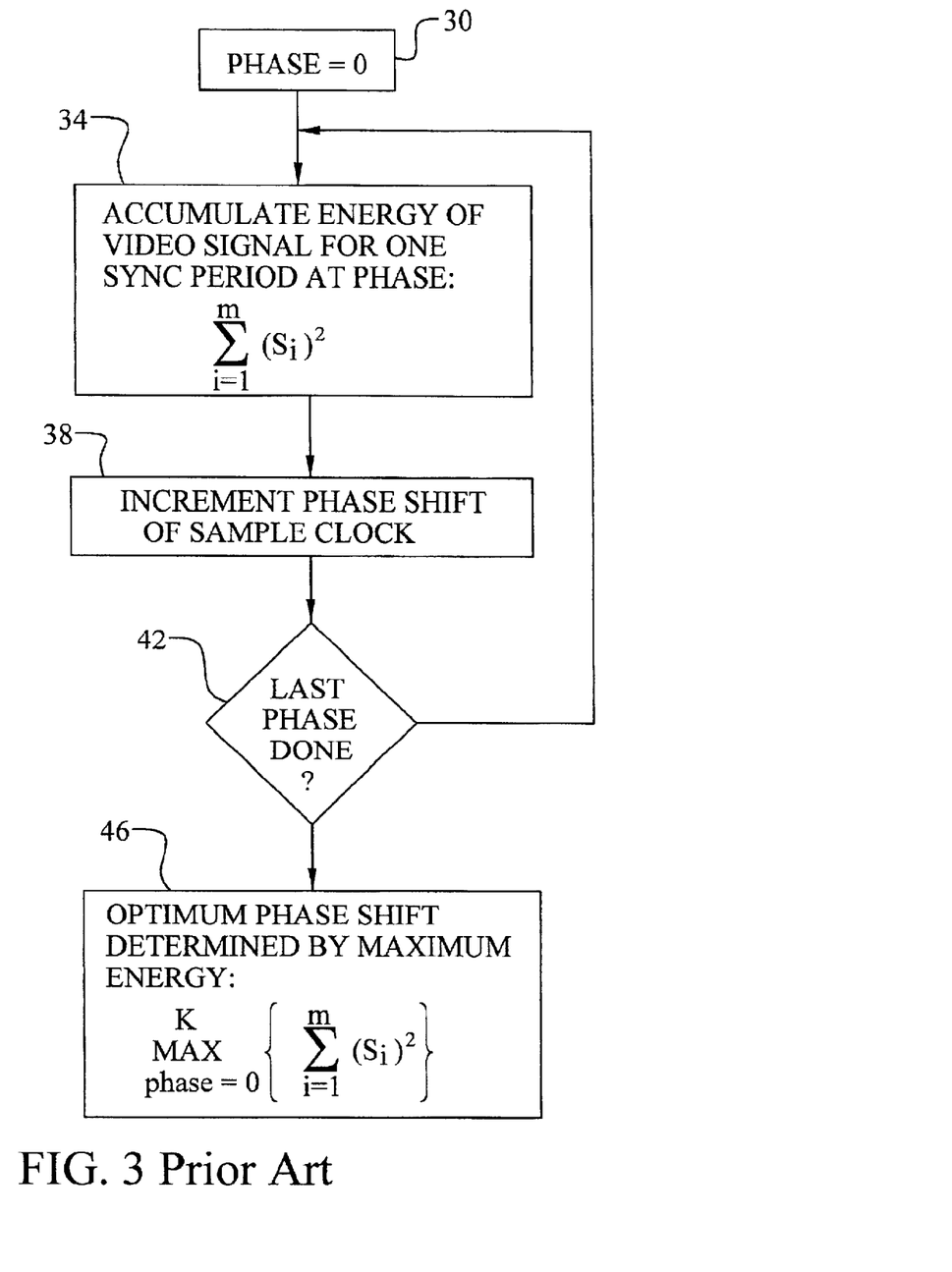
FIGS. 3 and 4 illustrate a prior art method for phase recovery using an energy accumulation method.

Referring now to FIG. 3, a prior art method for phase recovery is shown. This prior art method is called an energy accumulation phase recovery method. This method monitors the accumulated energy of the video samples $S_i$ at a series of different clock phase arrangements. The phase with the greatest accumulated sample energy is determined to be the correct sample phase.

Figure 4:
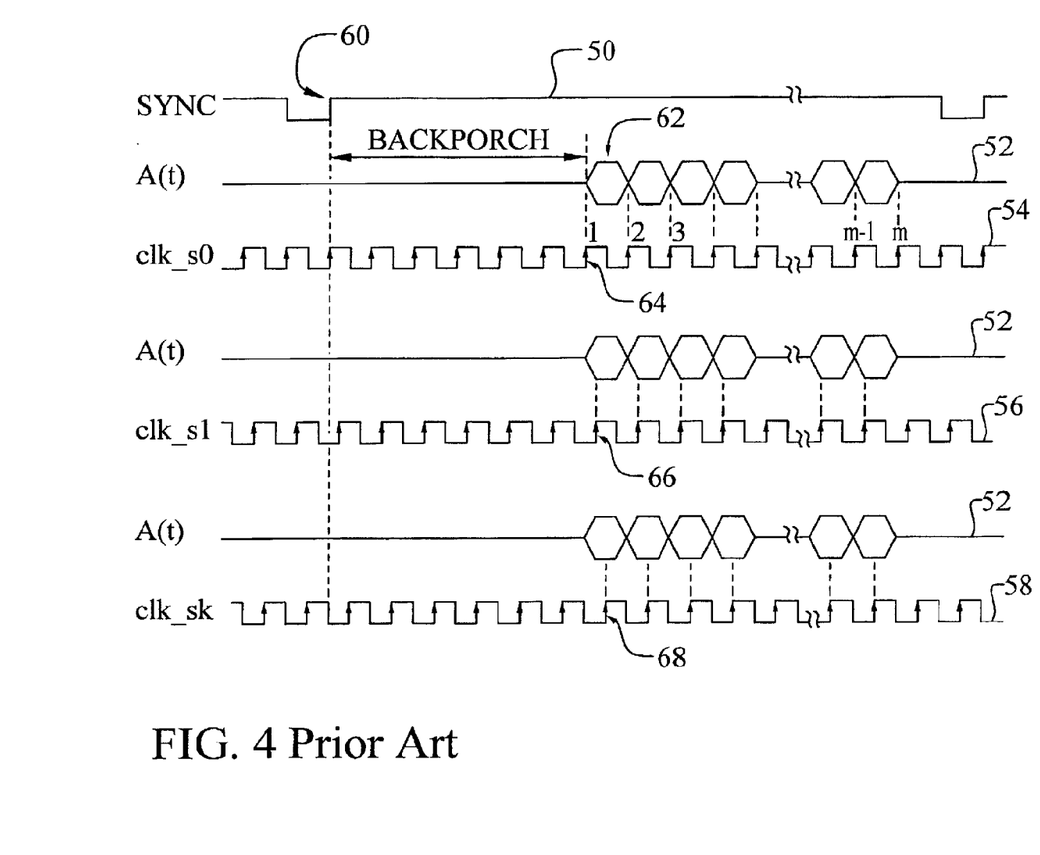

Referring now to FIG. 4, timing diagrams depicting the energy accumulation method are shown. Note first the synchronization signal SYNC.50. SYNC 50 is a standard signal from the VGA drive circuitry. The SYNC pulse occurs between each horizontal line of image data sent on the video signal A(t) 52. The SYNC pulse is used to synchronize or label the next line of data. More specifically, the trailing edge 60 of the SYNC pulse indicates that the pixel stream for the next horizontal line of data is about to be transmitted on A(t) after a specified wait time. In this case, the wait time between the trailing edge 60 of the SYNC pulse 50 and the first pixel transition of A(t) is a period commonly called the BACKPORCH. The BACKPORCH time determines how long the sampling circuit must wait until valid samples of the video signal A(t) can begin. Unfortunately, it is not possible for the video processing circuit to know with certainty the exact BACKPORCH time from the VGA driver.

Several sampling clocks, clk_s0 54, clk_s1 56, and clk_sk 58, are shown. Each sample clock represents a different sample clock phase that could be used for sampling the video signal A(t) 52. Referring again to FIG. 3, in the energy accumulation method, the phase is initialized to zero, which represents clk_s0, in step 30. Next, this zero phase is used to sample the video signal. Referring again to FIG. 4, A(t) 52 is sampled by clk_s0 at the rising edges 64. Referring again to FIG. 3, the energy of the sample stream $S_i$, which is proportional to $(S_i)^2$, is stored and summed in step 34 from the first sample to sample m where the VGA system is set for a display width of m pixels. Next, the phase of the sample clock is shifted in step 38. If the last phase shift, k, has not been complete in step 42, then the process is repeated. After the energy of all of the phases has been accumulated, the maximum phase shift is selected in step 46.

There are several significant problems with the conventional energy accumulation method of FIGS. 3 and 4. First, in cases where a large display matrix is used, the SYNC period (the time between SYNC pulses) can be very large. In this case, a complex accumulation circuit must be used to accumulate the energy of a large number of samples $S_1$. Second, if there is little or no variation in the voltage level of the video signal A(t), then this method does not work. For example, in the case of an all blue image, or blue screen, the video signal is nearly a constant DC level without transitions. In this case, the method cannot distinguish the maximum energy level and will fail. Third, if significant ground noise is present in the system, then this noise will be accumulated with the sample stream $S_i$. This noise can easily cause a wrong phase to be selected.

Several prior art inventions describe video signal processing methods and circuits. U.S. Pat. No. 6,108,043 to White describes a circuit for processing SYNC signals having different duration. U.S. Pat. No. 6,144,413 to Zatsman discloses a method and an apparatus for sampling a video signal. The method detects differences between samples of a filtered SYNC signal to determine the best sampling phase. U.S. Pat. No 6,233,020 to Wilber teaches a phase lock loop circuit for use in video processing.

SUMMARY OF THE INVENTION

A principal object of the present invention is to provide an effective and very manufacturable method and a circuit to generate an optimum phase shifted sampling clock for sampling a synchronized video signal A(t) having a synchronization signal SYNC pulse.

A further object of the present invention is to provide a method and a circuit that do not require an accumulation means.

Another further object of the present invention is to provide a method and a circuit that are effective for any video signal character, including DC levels such as blue screen.

Another further object of the present invention is to provide a method and a circuit that are effective in the presence of ground noise.

Another further object of the present invention is to provide a method and a circuit that are suitable for any video signal having a SYNC reference.

Another further object of the present invention is to provide a method and a circuit that can find the exact optimal sampling phase.

Another still further object of the present invention is to provide a method and a circuit that are compatible with jitter cancellation.

In accordance with the objects of this invention, a method to generate an optimum phase shifted sampling clock for sampling a synchronized video signal A(t) having a synchronization signal SYNC pulse is achieved. The method comprises, first, generating a sampling clock having a first edge aligned with a trailing edge of the SYNC pulse. The sampling clock period comprises the SYNC pulse period divided by M. Second, the number of sampling clock cycles N is counted from the trailing edge of the SYNC pulse until the A(t) value at the first edge of the sampling clock exceeds a minimum value. Third, the sampling clock and the SYNC pulse are phase shifted forward until the A(t) value at the first edge of the sampling clock first exceeds a minimum value on clock cycle N−1 to thereby establish a worst case phase shift of the sampling clock. Finally, A(t) is sampled at an offset from the worst case phase shift to thereby generate an optimum phase shifted sampling clock.

Also in accordance with the objects of this invention an optimized phase shifted sampling clock circuit for sampling a synchronized video signal A(t) having a synchronization signal SYNC pulse is achieved. The circuit comprises, first, a means of generating a sampling clock having a first edge aligned with a trailing edge of the SYNC pulse. The sampling clock period comprises the SYNC pulse period divided by M. Second, a means of counting the number of sampling clock cycles N from the trailing edge of the SYNC pulse until the A(t) value at the first edge of the sampling clock exceeds a minimum value is included. Third, a means of phase shifting the sampling clock and the SYNC pulse forward until the A(t) value at the first edge of the sampling clock first exceeds a minimum value on clock cycle N−1 is included. A worst case phase shift of the sampling clock can thus be established. Finally, a means of sampling A(t) at an offset from the worst case phase shift is used to thereby generate an optimum phase shifted sampling clock.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method and a circuit to generate an optimum phase shifted sampling clock for sampling a synchronized video signal A(t) having a synchronization signal SYNC pulse. It should be clear to those experienced in the art that the present invention can be applied and extended without deviating from the scope of the present invention.

Figure 5:
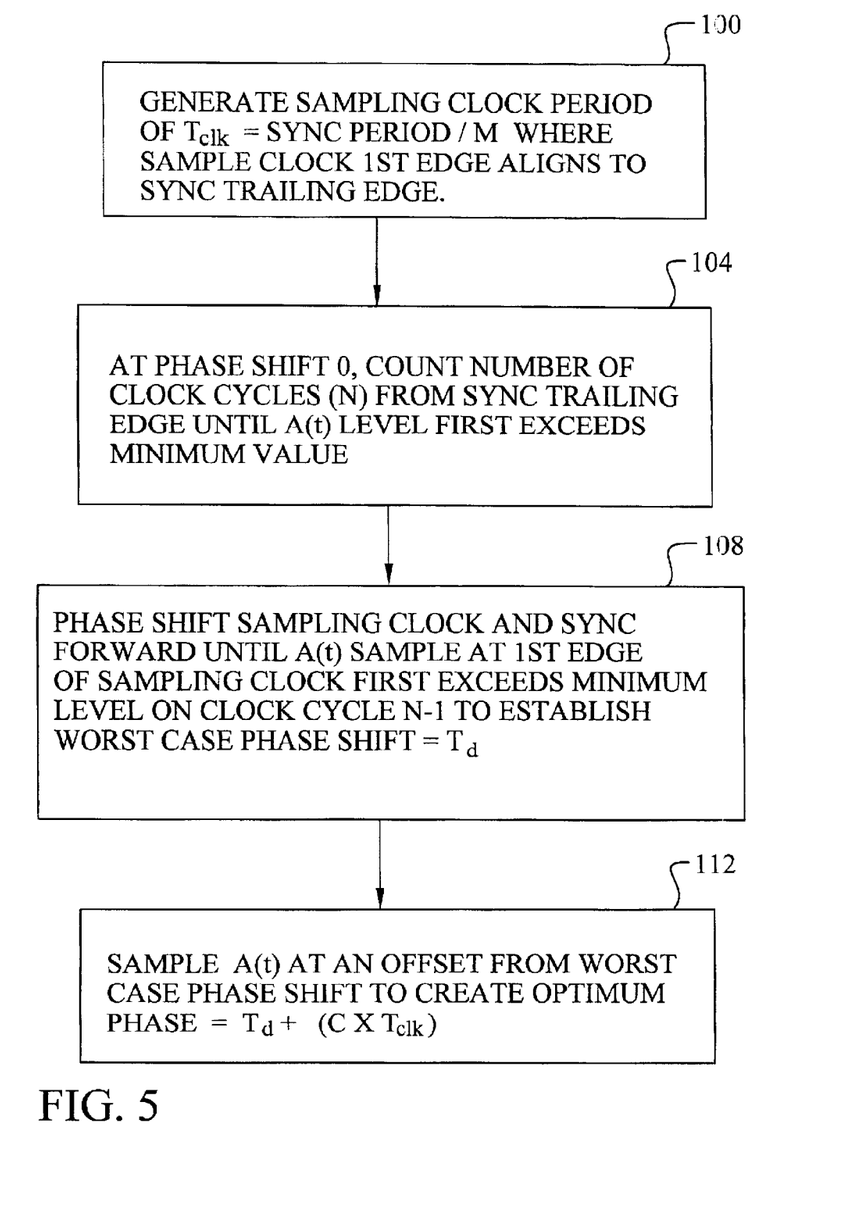
FIG. 5 illustrates the preferred embodiment of the phase recovery method of the present invention.

Referring now to FIG. 5, the preferred embodiment of the method of present invention is shown. The novel method is called a phase increase induce backporch decrease (PIBD) phase recovery, or PIBD phase recovery. The key concept of the method is to find the worst case phase shift for sampling the video data and to then add a fixed offset to this phase shift to create an optimum sampling position.

Figure 6:
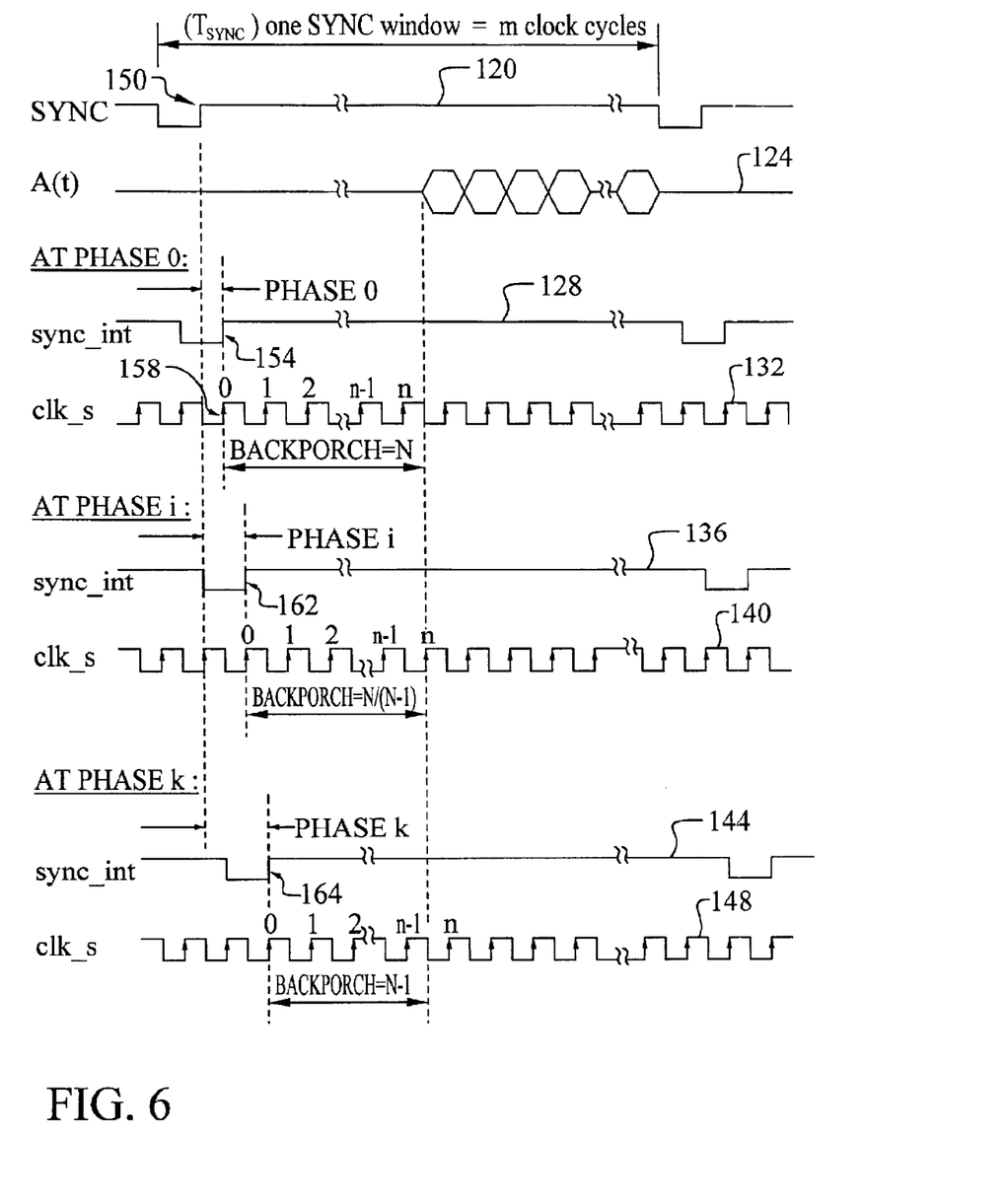
FIGS. 6 and 7 illustrate the timing performance of the phase recovery method of the present invention.
Figure 7:
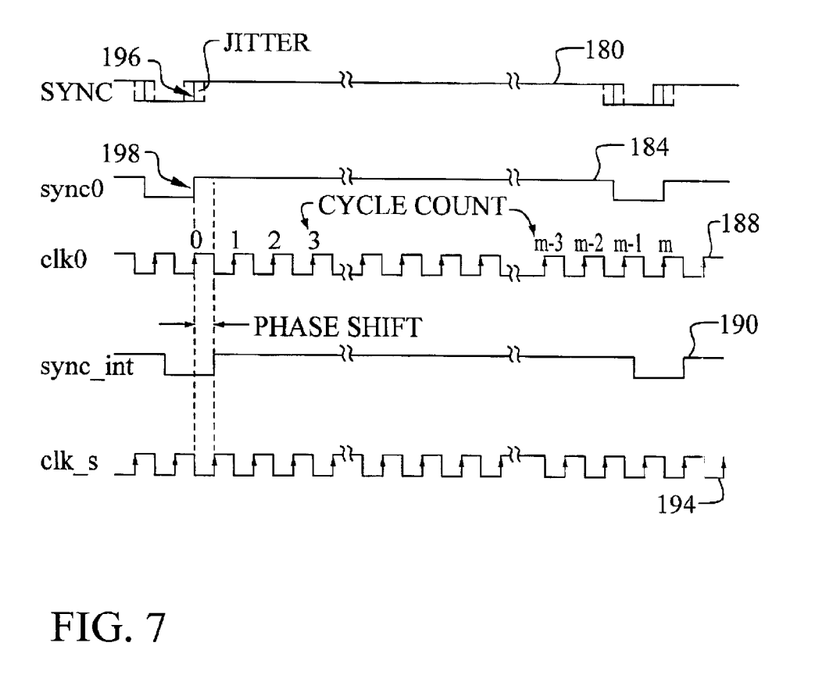

Several important features of the method are shown in FIG. 5 and further illustrated in the timing diagrams of FIGS. 6 and 7. The method comprises, first, generating a sampling clock having a first edge aligned with a trailing edge of the SYNC pulse in step 100. This sampling clock period comprises the SYNC pulse period divided by M. Referring to FIG. 6, the SYNC signal 120 defines the SYNC window, or frame, for streaming a single line of image data on the video signal A(t) 124. A critical aspect of the first step of signal processing is generating a sampling clock clk_s that is synchronized to the SYNC trailing edge 150. In addition, the clock period ($T_{CLK}$) must equal the SYNC period ($T_{SYNC}$) divided by the number of horizontal pixels per line (m). To generate the sampling clock clk_s, the preferred method is to use a phase lock loop (PLL) circuit.

As an important, though optional, feature, a jitter cancellation may be performed prior to the generation of the sampling clock in step 100. Referring now to FIG. 7, the SYNC signal 180 may exhibit significant jitter wherein the pulse edges 196 move in discrete steps out of alignment with the sampling clock. This can cause mistaken $S_i$ reads and results in poor performance. A jitter cancellation circuit may be used to eliminate this jitter and to generate a jitter-free version of SYNC labeled herein sync0 184. The jitter-free version of SYNC sync0 maintains the correct edge location 198 of the SYNC signal. The sync0 signal is then used as the SYNC reference in the remainder of the signal processing and in the generation of the synchronized sampling clock herein labeled clk0 188. Note that the time from trailing edge to trailing edge of sync0 is the SYNC frame. The sampling clock clk0 has m cycles during the SYNC frame.

As an important feature of the present invention, the method requires the ability to generate a phase shifted version of the sampling clock clk0 188 and the SYNC signal sync0 189. The phase shifted clock clk_s 194 and sync_int 190 are offset from the non-phase shifted versions by a discrete, but adjustable amount. By selecting the correct phase shift amount, the method can select the worst case sampling condition and, then, the best case condition.

Referring again to FIG. 5, as an important feature, at phase shift 0, the number of sampling clock cycles N is counted from the trailing edge of the SYNC pulse until the A(t) value at the first edge of the sampling clock exceeds a minimum value in step 104. Referring again to FIG. 6, and particularly the PHASE 0 case, the trailing edge 154 of sync_int 128 is synchronized with the rising edge of the 0 clock cycle of clk_s 158. Note that the phase 0 offset is shown as a discrete, non-zero amount. In fact, the phase 0 offset could be a time of 0 seconds.

The VGA system creates a wait time between the SYNC 120 trailing edge 150 and the first valid transition of the video input signal A(t) 124 called the BACKPORCH. In the PHASE 0 case, the BACKPORCH is referenced from the phase shifted sync_int until the transition of the A(t) signal above a minimum voltage. The method counts the number of clock cycles of clk_s until this transition occurs and labels this value N. In PHASE 0, the transition occurs during the N clock cycle and the BACKPORCH is N cycles long.

Referring again to FIG. 5, as an important feature, the sampling clock and the SYNC pulse are phase shifted forward until the A(t) value at the first edge of the sampling clock first exceeds a minimum value on clock cycle N−1 in step 108. This establishes a worst case phase shift of the sampling clock clk_s. Referring again to FIG. 6, and particularly the PHASE i case, the phase shift i+Δt, where Δt→0, has moved the sampling clock clk_s forward to the point where the first transition of A(t) occurs during the N−1 clock cycle. In this case the BACKPORCH is N−1 cycles long.

It is important to note that the phase shift of sync_int and clk_s is performed in small, discrete steps. For example, a step of about 0.4 nanoseconds may be used. Therefore, as the phase shift is increase to induce a decrease in the BACKPORCH time, the transition point between the N clock cycle and the N−1 clock cycle can be found. The PHASE i case shows the key transition point where the BACKPORCH is just N−1 cycles long. In the PHASE i case, sync_int 136 and clk_s 140 are phase shifted by phase i.

This PHASE i case is critical to the method of the present invention because it defines the worst case sampling location. The worst place to sample A(t) is at the transition. However, since the worst case has been found and will remained locked on due the PLL, this can be used as a reference point for sampling the video signal A(t) at a best case location that is an offset from the worst case location.

Referring again to FIG. 5, finally, A(t) is sampled at an offset from the worst case phase shift to thereby generate an optimum phase shifted sampling clock in step 112. This offset can be established because the first transition location of the video signal has been determined and corresponds to the boundary of the N−1 and N clock cycles. The optimum phase shift ($T_{optimum}$) for performing the actual sampling of the A(t) is therefore defined as the worst case phase shift ($T_d$) plus an offset that is a fraction (C) of the clock period ($T_{CLK}$) and is given by:

$$T_{optimum} = T_d + C \times T_{CLK},$$

where C can be any value between 0 and 1. In the ideal case, a most preferred offset of C=½ is used. However, if the transition time of each data is considered, then values of C between about ⅔ and ¾ are more preferred.

The novel method of the present invention has several advantages. First, the optimal sampling phase $T_{optimum}$ can be found to within the precision of the discrete phase shifting steps. Second, the complex accumulator function of the prior art energy accumulation method is not necessary. Third, the method works independent of the video signal character since it is keyed to the first transition of A(t) and not the accumulated energy of the entire string of $S_1$. Therefore, this method will work for a blue screen condition. Finally, this method is suitable for any application of a video signal having a SYNC reference.

Figure 8:
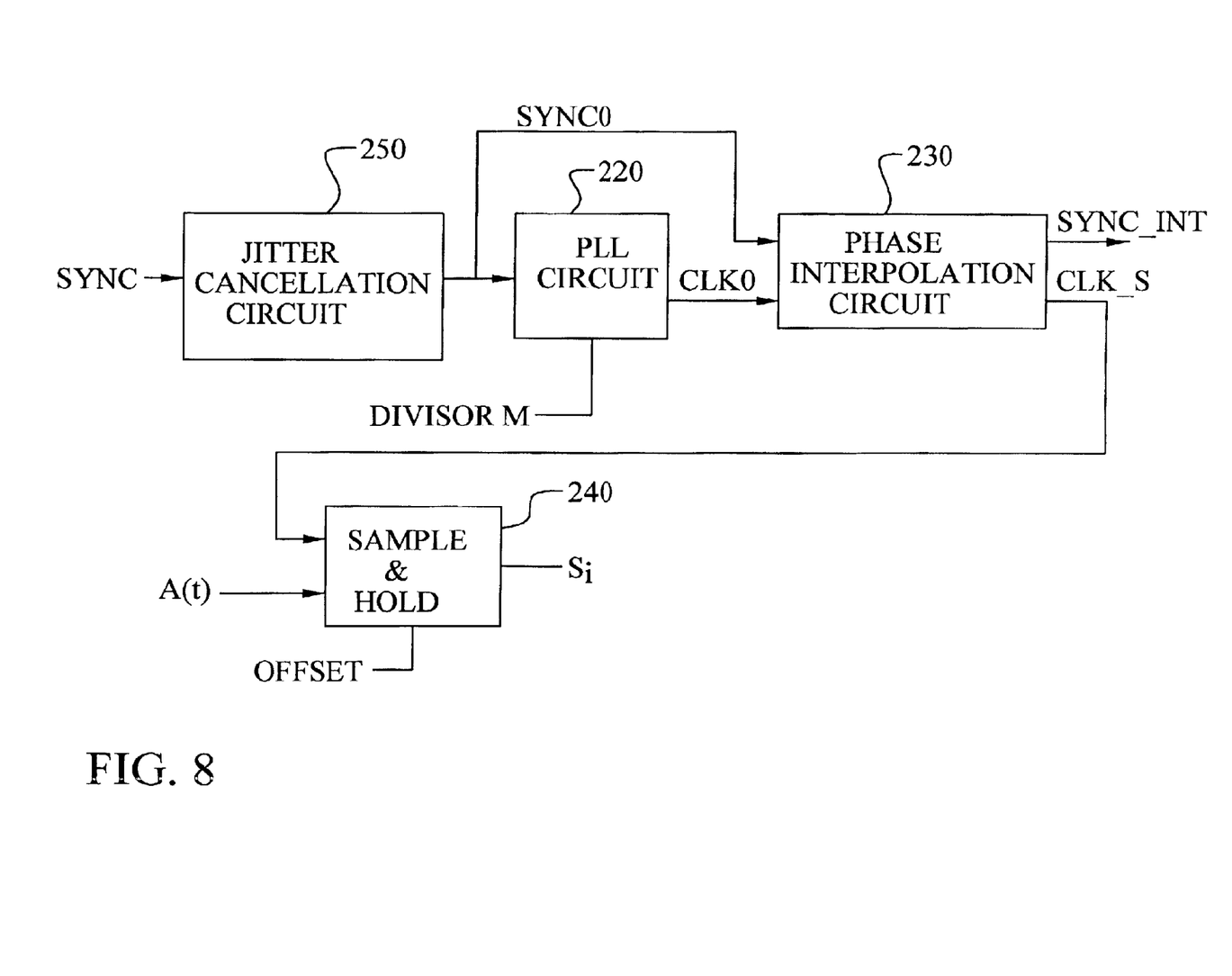
FIG. 8 illustrates the preferred embodiment of the phase recovery circuit of the present invention.

Referring now to FIG. 8, the preferred embodiment of the circuit of the present invention is shown. An optimized phase shifted sampling clock circuit for sampling a synchronized video signal A(t) having a synchronization signal SYNC pulse is illustrate. This circuit enables the PIBD method discussed above. The circuit comprises, first, a means of generating a sampling clock 220. The sampling clock clk0 has a first edge aligned with a trailing edge of the SYNC pulse sync0. The sampling clock period comprises the SYNC pulse period divided by M. The preferred means of generating the sampling clock comprises a PLL circuit 220. The PLL circuit 220 processes the SYNC input, in this case the jitter-free sync0, and a divisor M input to generate the clock output clk0 where clk0 has a period equal to the period of sync0 divided by M and where the first edge of clk0 is synchronized with the trailing edge of sync0.

As discussed above, a jitter cancellation circuit 250 may be used to remove jitter from the edges of the SYNC pulse. This circuit is not critical to the basic concepts of the present invention but represents a significant improvement on those concepts in practice.

Second, a phase interpolation circuit 230 provides, first, a means of counting the number of sampling clock cycles N from the trailing edge of the SYNC pulse until the A(t) value at the first edge of the sampling clock exceeds a minimum value. Second, the phase interpolation circuit 230 provides a means of phase shifting the sampling clock and the SYNC pulse forward until the A(t) value at the first edge of the sampling clock first exceeds a minimum value on clock cycle N−1. Finally, a means of sampling A(t) 240 at an offset from the worst case phase shift is used to thereby generate an optimum phase shifted sampling clock. The product of the phase interpolation circuit 230 is the worst case phase shifted clock clk_s. This worst case phase shifted clock clk_s is combined with the OFFSET such that the sampling time for the video signal A(t) is offset from the worst case to an optimal sampling time.

As shown in the preferred embodiments, the novel method and circuit to generate an optimum phase shifted sampling clock for sampling a synchronized video signal A(t) having a synchronization signal SYNC pulse provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to generate an optimum phase shifted sampling clock for sampling a synchronized video signal A(t) having a synchronization signal SYNC pulse, said method comprising:

generating a sampling clock having a first edge aligned with a trailing edge of said SYNC pulse wherein said sampling clock period comprises said SYNC pulse period divided by M;

counting the number of sampling clock cycles N from said trailing edge of said SYNC pulse until said A(t) value at said first edge of said sampling clock exceeds a minimum value;

thereafter phase shifting said sampling clock and said SYNC pulse forward until said A(t) value at said first edge of said sampling clock first exceeds a minimum value on clock cycle N−1 to thereby establish a worst case phase shift of said sampling clock; and thereafter sampling said A(t) at an offset from said worst case phase shift to thereby generate an optimum phase shifted sampling clock.

2. The method according to claim 1 further comprising canceling signal jitter in said SYNC pulse prior to said step of generating a sampling clock having a first edge aligned with a trailing edge of said SYNC pulse.

3. The method according to claim 1 wherein said step of generating a sampling clock having a first edge aligned with a trailing edge of said SYNC pulse comprises a phase lock loop.

4. The method according to claim 1 wherein said step of phase shifting said sampling clock and said SYNC pulse comprises discrete units of time.

5. The method according to claim 1 wherein said SYNC pulse comprises a horizontal synchronization pulse and M comprises a number of pixels on each horizontal line of a digital display.

6. The method according to claim 1 wherein said offset comprises ½ of said sampling clock period.

7. The method according to claim 1 wherein said offset comprises ¾ of said sampling clock period.

8. The method according to claim 1 wherein said synchronized video signal A(t) comprises a VGA format video signal.

9. The method according to claim 1 wherein said first edge of said sampling clock comprises a rising edge.

10. A method to generate an optimum, phase shifted sampling clock for sampling a synchronized video signal A(t) having a synchronization signal SYNC pulse, said method comprising:

generating a sampling clock having a first edge aligned with a trailing edge of said SYNC pulse wherein said sampling clock period comprises said SYNC pulse period divided by M;

counting the number of sampling clock cycles N from said trailing edge of said SYNC pulse until said A(t) value at said first edge of said sampling clock exceeds a minimum value;

thereafter phase shifting said sampling clock and said SYNC pulse forward until said A(t) value at said first edge of said sampling clock first exceeds a minimum value on clock cycle N−1 to thereby establish a worst case phase shift of said sampling clock; and thereafter sampling said A(t) at an offset from said worst case phase shift to thereby generate an optimum phase shifted sampling clock wherein said offset comprises a fraction of said sampling clock period.

11. The method according to claim 10 further comprising canceling signal jitter in said SYNC pulse prior to said step of generating a sampling clock having a first edge aligned with a trailing edge of said SYNC pulse.

12. The method according to claim 10 wherein said step of generating a sampling clock having a first edge aligned with a trailing edge of said SYNC pulse comprises a phase lock loop.

13. The method according to claim 10 wherein said step of phase shifting said sampling clock and said SYNC pulse comprises discrete units of time.

14. The method according to claim 10 wherein said SYNC pulse comprises a horizontal synchronization pulse and M comprises a number of pixels on each horizontal line of a digital display.

15. The method according to claim 10 wherein said synchronized video signal A(t) comprises a VGA format video signal.

16. The method according to claim 10 wherein said first edge of said sampling clock comprises a rising edge.

17. An optimized phase shifted sampling clock circuit for sampling a synchronized video signal A(t) having a synchronization signal SYNC pulse, said circuit comprising:

a means of generating a sampling clock having a first edge aligned with a trailing edge of said SYNC pulse wherein said sampling clock period comprises said SYNC pulse period divided by M;

a means of counting the number of sampling clock cycles N from said trailing edge of said SYNC pulse until said A(t) value at said first edge of said sampling clock exceeds a minimum value;

a means of phase shifting said sampling clock and said SYNC pulse forward until said A(t) value at said first edge of said sampling clock first exceeds a minimum value on clock cycle N−1 to thereby establish a worst case phase shift of said sampling clock; and a means of sampling said A(t) at an offset from said worst case phase shift to thereby generate an optimum phase shifted sampling clock.

18. The circuit according to claim 17 further comprising a means of canceling signal jitter in said SYNC pulse.

19. The circuit according to claim 17 wherein said means of generating a sampling clock having a first edge aligned with a trailing edge of said SYNC pulse comprises a phase lock loop.

20. The circuit according to claim 17 wherein said means of phase shifting said sampling clock and said SYNC pulse comprises discrete units of time.

21. The circuit according to claim 17 wherein said SYNC pulse comprises a horizontal synchronization pulse and M comprises a number of pixels on each horizontal line of a digital display.

22. The circuit according to claim 17 wherein said offset comprises ½ of said sampling clock period.

23. The circuit according to claim 17 wherein said offset comprises ¾ of said sampling clock period.

24. The circuit according to claim 17 wherein said offset comprises a fraction of said sampling period wherein said fraction can be value between about 0 and 1.

25. The circuit according to claim 17 wherein said synchronized video signal A(t) comprises a VGA format video signal.

26. The circuit according to claim 17 wherein said first edge of said sampling clock comprises a rising edge.

* * * * *